United States Patent
Liu et al.

(10) Patent No.: US 10,811,290 B2
(45) Date of Patent: Oct. 20, 2020

(54) SYSTEMS AND METHODS FOR INSPECTION STATIONS

(71) Applicant: Taiwan Semiconductor Manufacturing Co., Ltd., Hsinchu (TW)

(72) Inventors: Yan-Hong Liu, Zhudong Township, Hsinchu County (TW); Chien-Chih Wu, Hsinchu (TW); Che-Fu Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/987,604

(22) Filed: May 23, 2018

(65) Prior Publication Data
US 2019/0362994 A1    Nov. 28, 2019

(51) Int. Cl.
| | | |
|---|---|---|
| *H01L 21/67* | (2006.01) | |
| *H01L 21/677* | (2006.01) | |
| *H01L 21/687* | (2006.01) | |
| *G06T 7/00* | (2017.01) | |
| *H04N 5/372* | (2011.01) | |

(52) U.S. Cl.
CPC ...... *H01L 21/67288* (2013.01); *G06T 7/0004* (2013.01); *H01L 21/67742* (2013.01); *H01L 21/68707* (2013.01); *H01L 21/68764* (2013.01); *G06T 2207/10061* (2013.01); *G06T 2207/30148* (2013.01); *G06T 2207/30164* (2013.01); *H04N 5/372* (2013.01)

(58) Field of Classification Search
CPC ............... G06T 7/0002; G06T 7/0004; G06T 2207/30168; G01N 21/88
See application file for complete search history.

(56) References Cited

U.S. PATENT DOCUMENTS

| | | | | |
|---|---|---|---|---|
| 4,629,319 A | * | 12/1986 | Clarke | G01N 21/88 356/237.2 |
| 5,825,500 A | * | 10/1998 | Iino | G01N 21/88 356/394 |
| 6,384,421 B1 | * | 5/2002 | Gochar, Jr. | G01N 21/95 209/563 |
| 6,677,602 B1 | | 1/2004 | Norton | |
| 7,069,155 B1 | * | 6/2006 | Phan | G01N 21/3563 382/149 |
| 10,366,484 B2 | * | 7/2019 | Takazawa | H04N 7/18 |
| 2001/0016061 A1 | * | 8/2001 | Shimoda | G06T 7/0004 382/149 |
| 2003/0139838 A1 | * | 7/2003 | Marella | G01N 21/55 700/110 |
| 2003/0169916 A1 | * | 9/2003 | Hayashi | G01N 21/9503 382/145 |

(Continued)

*Primary Examiner* — Pankaj Kumar
*Assistant Examiner* — Timothy R Newlin
(74) *Attorney, Agent, or Firm* — Duane Morris LLP

(57) ABSTRACT

In an embodiment, a workstation includes: a processing chamber configured to process a workpiece; a load port configured to interface with an environment external to the workstation; a robotic arm configured to transfer the workpiece between the load port and the processing chamber; and a defect sensor configured to detect a defect along a surface of the workpiece when transferred between the load port and the processing chamber.

20 Claims, 11 Drawing Sheets

(56) References Cited

U.S. PATENT DOCUMENTS

| | | | |
|---|---|---|---|
| 2004/0141640 A1* | 7/2004 | Lee | G06T 7/0004 |
| | | | 382/149 |
| 2004/0264760 A1* | 12/2004 | Ishikawa | G01N 21/95607 |
| | | | 382/145 |
| 2005/0013474 A1* | 1/2005 | Sim | G01N 21/9503 |
| | | | 382/145 |
| 2005/0276466 A1* | 12/2005 | Vaccaro | G01B 5/008 |
| | | | 382/152 |
| 2006/0242820 A1* | 11/2006 | Townsend | B23P 19/041 |
| | | | 29/703 |
| 2006/0274304 A1* | 12/2006 | Haller | G01N 21/8806 |
| | | | 356/237.1 |
| 2007/0211240 A1* | 9/2007 | Matsumoto | G01N 21/8851 |
| | | | 356/237.1 |
| 2009/0223592 A1* | 9/2009 | Procyshyn | B25J 21/00 |
| | | | 141/2 |
| 2009/0312958 A1* | 12/2009 | Dai | B23K 9/0956 |
| | | | 702/40 |
| 2013/0336576 A1* | 12/2013 | Knight | G06T 7/41 |
| | | | 382/152 |
| 2014/0270466 A1* | 9/2014 | Dam | G01M 17/027 |
| | | | 382/141 |
| 2015/0019014 A1* | 1/2015 | Kim | B25J 9/1697 |
| | | | 700/259 |
| 2015/0177156 A1* | 6/2015 | Seo | G01L 1/00 |
| | | | 348/90 |
| 2016/0209375 A1* | 7/2016 | Yamaoka | G01N 29/04 |

* cited by examiner

SYSTEMS AND METHODS FOR INSPECTION STATIONS

BACKGROUND

In the manufacture of integrated circuits, semiconductor substrates may be loaded into various reaction and other processing chambers using automated equipment for processing. Typically, the automated equipment includes a robot or robotic arm that may transfer a semiconductor workpiece from a wafer pod or a load port through a central transfer chamber and into one or more processing chambers disposed in connection to the transfer chamber. A semiconductor workpiece may be an unfinished wafer or semiconductor device that has yet to undergo a transformative process within a processing chamber (e.g., a semiconductor processing chamber) before being finished and ready for a final clean and/or inspection. The robotic arm is typically disposed in a central location in the transfer chamber to provide access to all of the chambers connected to the transfer chamber.

Semiconductor workpieces are traditionally not inspected while they are being processed. Rather, inspection for defects typically occurs after processing is completed by a workstation. For example, typical inspection of semiconductor workpieces for defects is performed at a separate workstation after exiting a workstation that processes the semiconductor workpieces. However, during the course of transporting a semiconductor workpiece and/or processing a semiconductor workpiece in a processing chamber or workstation, a semiconductor workpiece may become damaged and/or unusable, wasting any further effort put into processing the semiconductor workpiece. Therefore, conventional techniques of inspecting a wafer, or a semiconductor workpiece are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
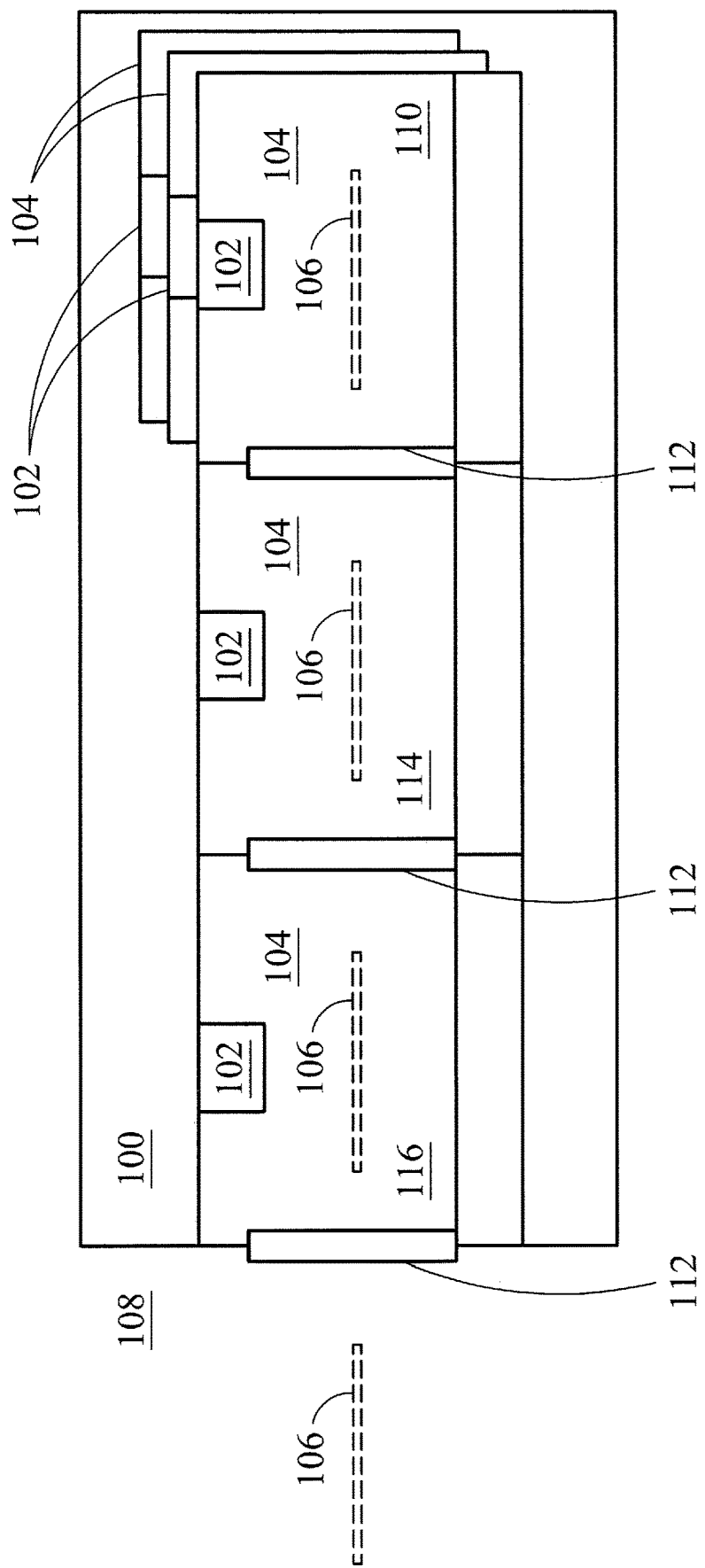
FIG. 1A is a cross sectional illustration of a process workstation with defect sensors disposed in each chamber, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As introduced above, a semiconductor workpiece may be an unfinished wafer or semiconductor device that has yet to undergo a transformative process (e.g., yet to be processed in a processing chamber) before being finished and ready for a final clean and/or inspection. This transformative process may refer to processing that produces a structural change in a semiconductor workpiece, rather than just an inspection or cleaning of a workpiece that does not structurally change the workpiece. A semiconductor workpiece may be more simply referred to as a workpiece.

The present disclosure provides various embodiments of a semiconductor workpiece process inspection workstation. A semiconductor workpiece process inspection workstation, or more simply termed as a process workstation, may be a workstation that includes at least one defect sensor for inspection of a workpiece during wafer or workpiece processing. As noted above, this may differ from traditional workstations which do not include defect sensors for inspection of a workpiece during processing, opting rather for inspection of a finished product rather than a work-in-progress workpiece. Also, defect sensors may differ from other sensors as defect sensors may specifically gather defect sensor information concerning a workpiece for detection of workpiece defects. This may be in contrast to other sensors that may provide feedback on specific operations within a workstation, such as sensors within a processing chamber that inspect whether the process performed within the processing chamber is performed to completion. In certain embodiments, the finished product may refer to a semiconductor workpiece placed finally in a load port for removal from the process workstation after processing by all relevant processing chambers (e.g., after undergoing all relevant structural changes) within the process workstation. For example, a process workstation may include a defect sensor that scans a workpiece to collect defect sensor data to characterize the workpiece as it is transported by a robotic arm between a load port that receives a workpiece at a process workstation to a processing chamber that processes the workpiece. In certain embodiments, the defect sensor may collect defect sensor data of a workpiece en route from a load port to a processing chamber. In other embodiments, the defect sensors may collect defect sensor data of a workpiece en route from a processing chamber to a load port. For example, the defect sensors may be configured to collect defect sensor data while the workpiece is being moved by a robotic arm or may be configured to collect defect sensor data characterizing the workpiece while the workpiece is immobile and/or awaiting transport or movement by the robotic arm at a location within the workstation.

In various embodiments, the defect sensor may be part of an inspection station within a process workstation. The inspection station may be a region of the process workstation specific for inspection of a workpiece. For example, the inspection station may include a pedestal on which a workpiece may be placed and which may also rotate the workpiece. A defect sensor may collect defect sensor data characterizing the workpiece while the workpiece is rotated. This defect sensor data may be analyzed to determine whether there are defects along a surface of the workpiece. In certain embodiments, this defect sensor may be a bevel defect sensor configured to collect defect sensor data along a workpiece's bevel, or extreme outer edge, to characterize workpiece defects at the workpiece's bevel. In other embodiments, the defect sensor may be configured to collect defect sensor data along a top or a bottom of a workpiece as the workpiece is spun by the pedestal.

Various types of defect sensors may be utilized for such inspections, such as optical defect sensors, weight defect sensors, temperature defect sensors, and the like. Examples of optical defect sensors may include, for example, a charge coupled device (CCD) or scanning electron microscope (SEM). These optical defect sensors may detect radiation across the visible light and/or non-visible light spectrum (e.g., the infrared spectrum). Weight defect sensors may be configured to detect a weight of a workpiece. For example, a workpiece may be deposited on a weight defect sensor as the workpiece is either handled or awaiting transport (e.g., depositing a workpiece on a weight defect sensor at a robotic arm or within a load port or other region of the process workstation). Temperature defect sensors may be configured to assess the temperature of a workpiece. For example, temperature defect sensors may include an infrared defect sensor configured to detect temperature as a function of infrared radiation, or a temperature defect sensor in a chamber that detects for changes when a workpiece is within the chamber as opposed to when the workpiece is not in the chamber. In certain embodiments, a single defect sensor may be utilized to inspect a workpiece for workpiece defects. However, in other embodiments, multiple defect sensors may be utilized either simultaneously or in series to inspect a workpiece for workpiece defects.

Furthermore, defect sensors may assess workpieces over time by collecting defect sensor data as a single workpiece progresses through a process workstation, or across multiple workpieces inspected by a particular defect sensor. For example, defect sensors may collect temperature data, image data, and/or weight data as a single workpiece progresses through a process workstation, or across multiple workpieces inspected by a particular defect sensor. Accordingly, by analyzing the aggregated data over time, an workpiece defect may be determined based on detection of an outlier from the aggregated data. In certain embodiments, these outliers may determine threshold values, which when passed, may define a workpiece defect. These outliers may be determined in accordance with conventional statistical analysis for outliers. For example, these outliers may define threshold values for a workpiece that is too heavy or too light, which may be indicative of a workpiece that is broken.

Additionally, the processing chambers may be part of same or different tools. These processing chambers may be part of any tool that may be utilized in the processing of workpieces, such as physical vapor deposition (PVD) tools, chemical vapor deposition (CVD) tools, chemical mechanical planarization (CMP) tools, diffusion (DIF) tools, wet etching tools, dry etching tools, photolithography tools (e.g., G-line, H-line, and/or I-line tools), deep ultraviolet (DUV) tools, overlay (OVL) tools, medium current implantation (MCI) tools, high current implantation (HCI) tools, plasma ashing (PR asher) tools, and the like. The functionalities and configurations of each individual tool is conventional (e.g., well known) and will not be discussed in detail herein for brevity.

Also, defect sensors (e.g., sensors utilized for detecting workpiece defects) may be disposed either, or a combination of, above, to the side (e.g., along a bezel) and/or under a workpiece to be inspected. In various embodiments, a workpiece's bevel, or extreme edge around a workpiece's circumference, may be assessed for workpiece defects utilizing a single, or multiple defect sensors. These defect sensors may be positioned around a workpiece's edge so that various perspectives along a workpiece's edge may be assessed, with defect sensor data collected which may be analyzed for workpiece defect determination. For example, as defect sensor may collect defect sensor data at a 90 degrees location, 60 degrees location, 30 degrees location and/or 0 degree location, as will be discussed further below.

In certain embodiments, remediation may be performed when a workpiece defect is detected. The remediation may include pausing the processing of the workpiece pending a spot fix of the workpiece defect and/or removing the workpiece from processing in favor of processing another workpiece without the defect (e.g., restarting processing with a new workpiece). Workpiece defects may include any type of defect detectible by the defect sensor which may reduce workpiece fabrication yield, such as a crack, discoloration, scratch, peel, and/or a chip on a workpiece. Workpiece defect detection may be accomplished through the utilization of workpiece defect detection techniques, such as by the detection of non-uniformities, outliers, and/or variances as detected within collected sensor data from defect sensors. In particular embodiments, the remediation may be dependent upon the type of workpiece defect detected, such as where a crack may provoke a restart of processing with a new workpiece while debris deposited on the workpiece may provoke a spot fix of the workpiece defect (e.g., removal of the debris).

FIG. 1A is a cross sectional illustration of a process workstation 100 with defect sensors 102 disposed in each chamber 104A-104E, in accordance with some embodiments. A workpiece 106 is illustrated with dotted lines to indicate that the workpiece 106 may be transported or transferred from outside 108 of the process workstation 100 and through the various chambers 104A-104E of the process workstation to be processed by a processing chamber 104C of the process workstation 100. The process workstation 100 may include a housing within which all of the constituent components of the process workstation are defined, bound, and/or enclosed. As noted above, the processing chamber 104C may perform a transformative process that changes a structural or physical aspect of the workpiece 106 in furtherance of workpiece processing. Also, although the defect sensors 102 are illustrated as being along a ceiling of each chamber 104A-104E, the defect sensors 102 may be disposed in any location within a particular chamber 104A-104E, as desired for different applications in various embodiments. For example, defect sensors 102 may be disposed along a side wall and/or a floor of a chamber 104A-104E.

The process workstation 100 may include a variety of chambers 104A-104E, or regions. Each of the chambers 104A-104E may be separated by a portal or door 112. However, in certain embodiments, the process workstation may not include a specific door between different chambers 104A-104E. Doors 112 may be utilized to separate a particular process or environment within a chamber from interference with a neighboring environment or process.

A transfer chamber 104B may be disposed between a load port 104A and the processing chamber 104C. The transfer chamber 104B may include a robotic arm, or other manner of transporting a workpiece between the load port 104A and the processing chamber 104C. The load port 104A may be a first port of entry, and last port of egress, for a workpiece in the course of processing by the processing chamber 104C within the workstation 100. For example, an automated material handling system (AMHS) outside 108 of the process workstation 100 may deposit a workpiece within the load port 104A. The AMHS may itself have a robotic arm that facilitates such deposit of the workpiece within the load port 104A. Furthermore, the load port 104A may be separated from the outside 108 via a door 112, or may be open to the outside 108 such as by being demarcated from the outside 108 without the door, in certain embodiments. As will be discussed further below, the transfer chamber 104B may have a robotic arm that may move between the load port 104A and the processing chamber 104C. Also, a defect sensor 102 in any one of, or each of the load port 104A, transfer chamber 104B, and/or processing chamber 104C may collect defect sensor data that characterizes the workpiece for possible workpiece defects while the workpiece is transported in and between the various chambers 104A-104E. Although specific chambers 104A-104E have been designated as a load port 104A, transfer chamber 104B and/or a processing chamber 104C, the use, function, number, and/or configuration of the chambers 104A-104E within a process workstation 100 may be modified as desired for different applications in various embodiments. For example, as will be discussed further below, the chambers 104A-104E may also feature an inspection station specific for the inspection of a workpiece transported or en route between a load port and a processing chamber.

Figure 1B:
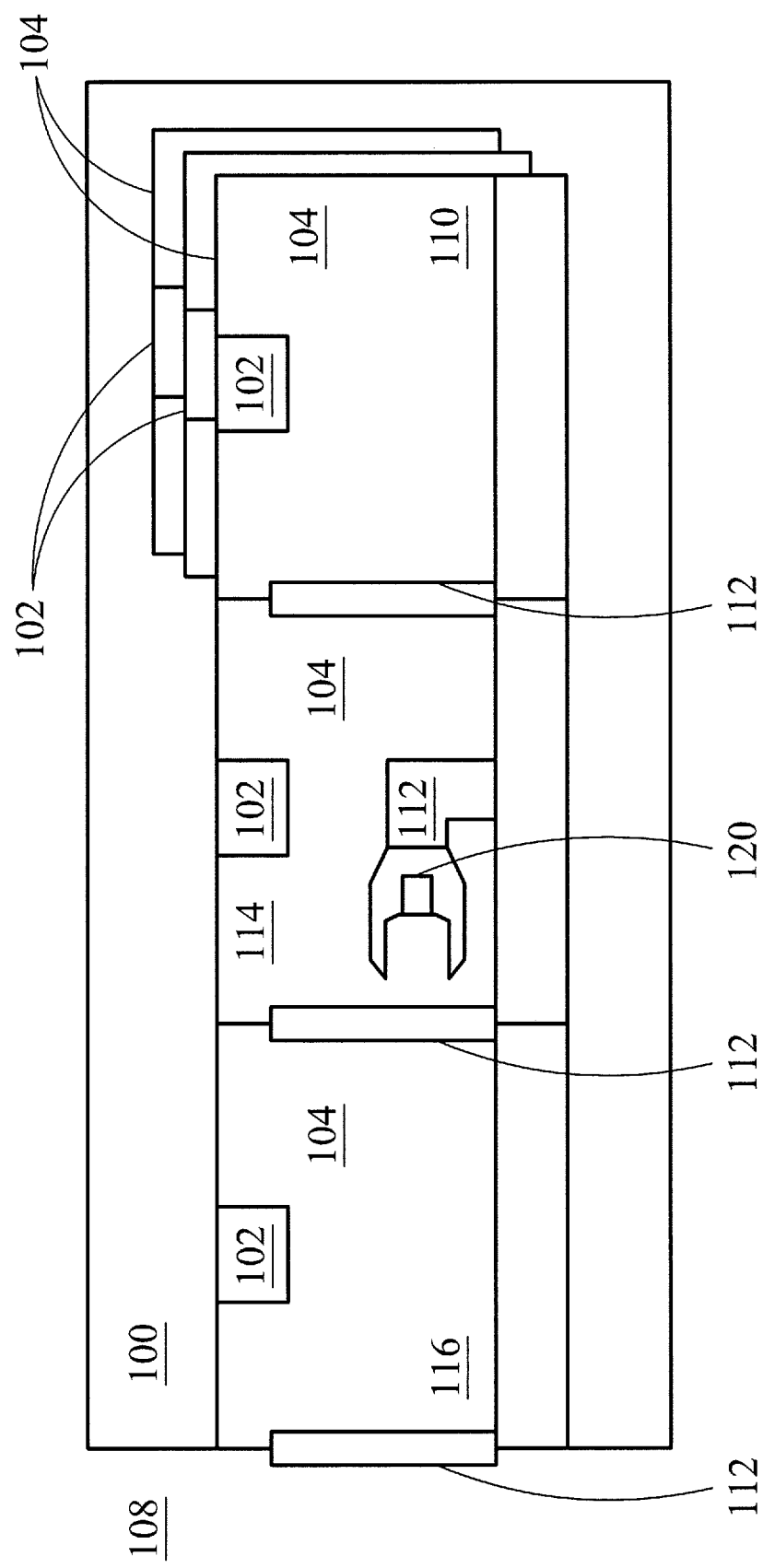
FIG. 1B is a cross sectional illustration of a process workstation with defect sensors disposed in a transfer chamber, in accordance with some embodiments.

FIG. 1B is a cross sectional illustration of the process workstation 100 with an additional defect sensor disposed in the transfer chamber 104B, in accordance with some embodiments. Accordingly, FIG. 1B may be similar to 1A, except that an additional defect sensor 120 and a robotic arm 122 are illustrated in the transfer chamber 104B.

As introduced above, the robotic arm 122 may be a programmable mechanical arm to grasp, hold, and manipulate objects. Specifically, the robotic arm 122 may manipulate (e.g., move) a workpiece within the robotic arm's work envelope (e.g., a three-dimensional shape that defines the boundaries that the robotic arm can reach and manipulate a workpiece or other target). The robotic arm 122 may include a gripper hand that may be any type of effector used for grasping or holding an object, such as a workpiece, by the robotic arm 122. The gripper hand may utilize any type of gripping mechanism to manipulate an object, such as a workpiece. For example, the gripping mechanism may be a pressure gripper (e.g., gripping by applying pressure to an object, such as with a pincer type motion), an envelope gripper (e.g., gripping by surrounding an object to be manipulated), a vacuum gripper (e.g., gripping by suction force), and a magnetic gripper (e.g., gripping by use of electromagnetic forces). In certain embodiments, the gripper hand may utilize at least two fingers, such as with one opposing the other. The multiple fingers may be utilized to apply pressure as a pressure gripper and or as an envelope gripper.

An additional defect sensor 120 may be disposed, for example, on the robotic arm 122. In certain embodiments, the additional defect sensor 120 may be disposed on a gripper hand and/or on a finger of the robotic arm 122. The additional defect sensor 120 may be configured to assess a workpiece being transported by the robotic arm 122. For example, the additional defect sensor 120 may be an image sensor configured to collect image sensor data of the workpiece as the workpiece is transported by the robotic arm 122. As another example, the additional defect sensor 120 may be a weight sensor configured to detect the weight of a workpiece as handled by the robotic arm 122. As yet another example, the additional defect sensor 120 may be a temperature sensor configured to detect the temperature of a workpiece as the workpiece is transported by the robotic arm 122.

Figure 1C:
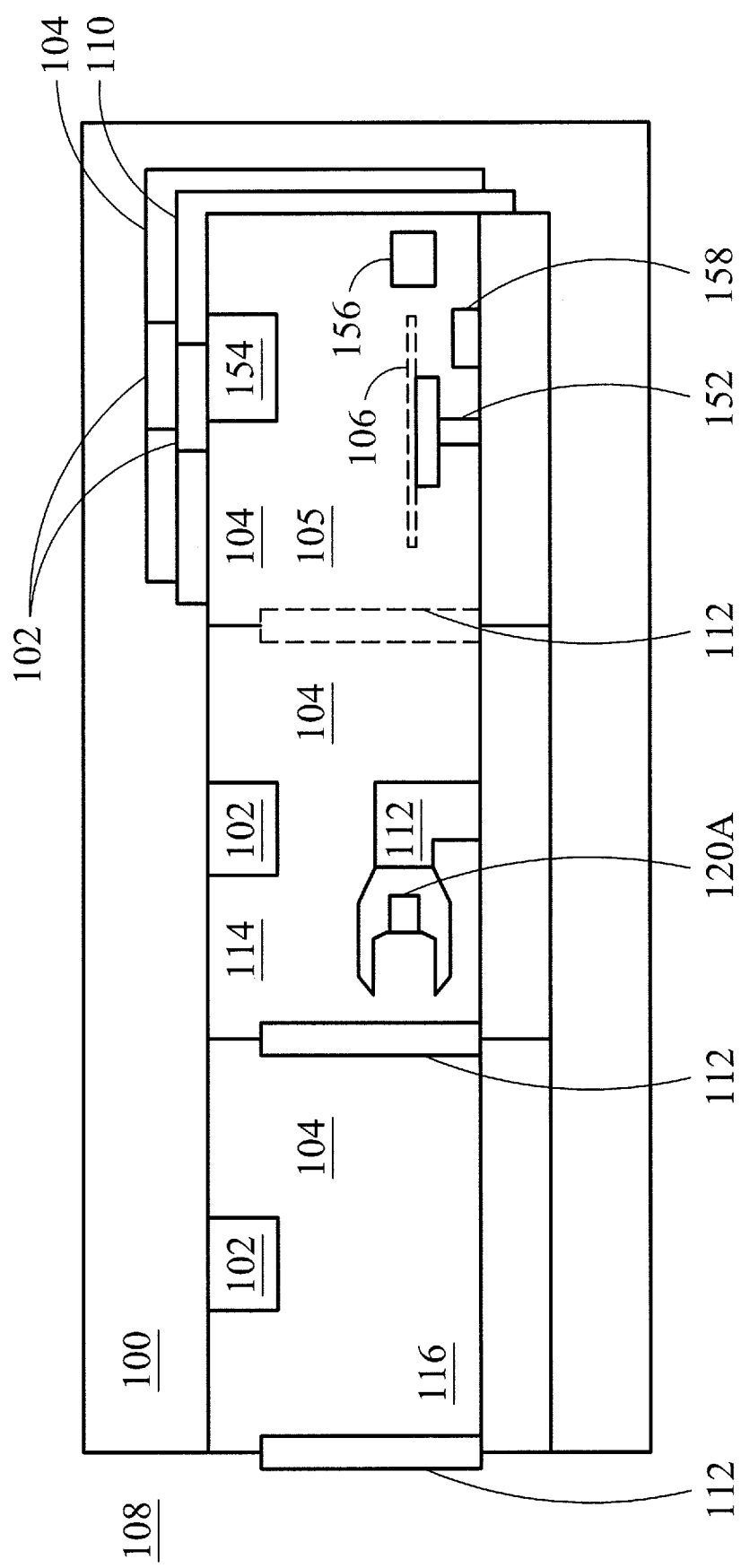
FIG. 1C is a cross sectional illustration of a process workstation with an inspection station, in accordance with some embodiments.

FIG. 1C is a cross sectional illustration of the process workstation 100 with an inspection station 150, in accordance with some embodiments. Accordingly, FIG. 1C may be similar to 1B, except that the inspection station 150 is also illustrated in FIG. 1C. Furthermore, the processing chamber 104C may still be part of the process workstation 100, but not illustrated in detail.

The inspection station 150 may be a specialized chamber, or region of the process workstation 100 specific for the inspection of a workpiece 106. The inspection station may include a pedestal 152 configured to rotate the workpiece 106 to allow the defect sensors 154, 156, 158 to collect sensor data that characterizes the workpiece. The defect sensors 154, 156, 158 may include, for example, a top defect sensor 154 configured to gather sensor data characterizing a top of the workpiece 106, a bevel defect sensor 156 configured to gather sensor data characterizing a bevel or side of the workpiece 106 and/or a bottom defect sensor 158 configured to gather sensor data characterizing a bottom of the workpiece 106. In certain embodiments, the sensors 154, 156, 158 of an inspection station may be image sensors configured to gather image data characterizing the surface of the workpiece 106. Also, in particular embodiments, the pedestal may be configured to rotate the workpiece at least 360 degrees for each of the sensors 154, 156, 158 to characterize the semiconductor workpiece across an angular space (e.g., across all 360 degrees). In particular embodiments, the inspection station 150 may be combined with an orientator to provide specific orientation information concerning the workpiece, as will be discussed further below.

The door 112 between the transfer chamber 104B and the inspection station 150 is illustrated in phantom to indicate that such a portal or partition is optional and may be present in some embodiments and may not be present in other embodiments. For example, the inspection station 150 may be in a continuous region with the transfer chamber 104B in certain embodiments. However, in other embodiments, the inspection station 150 may be separable from the transfer chamber 104B, or any other chamber 104A-104E, by a door 112.

Figure 2:
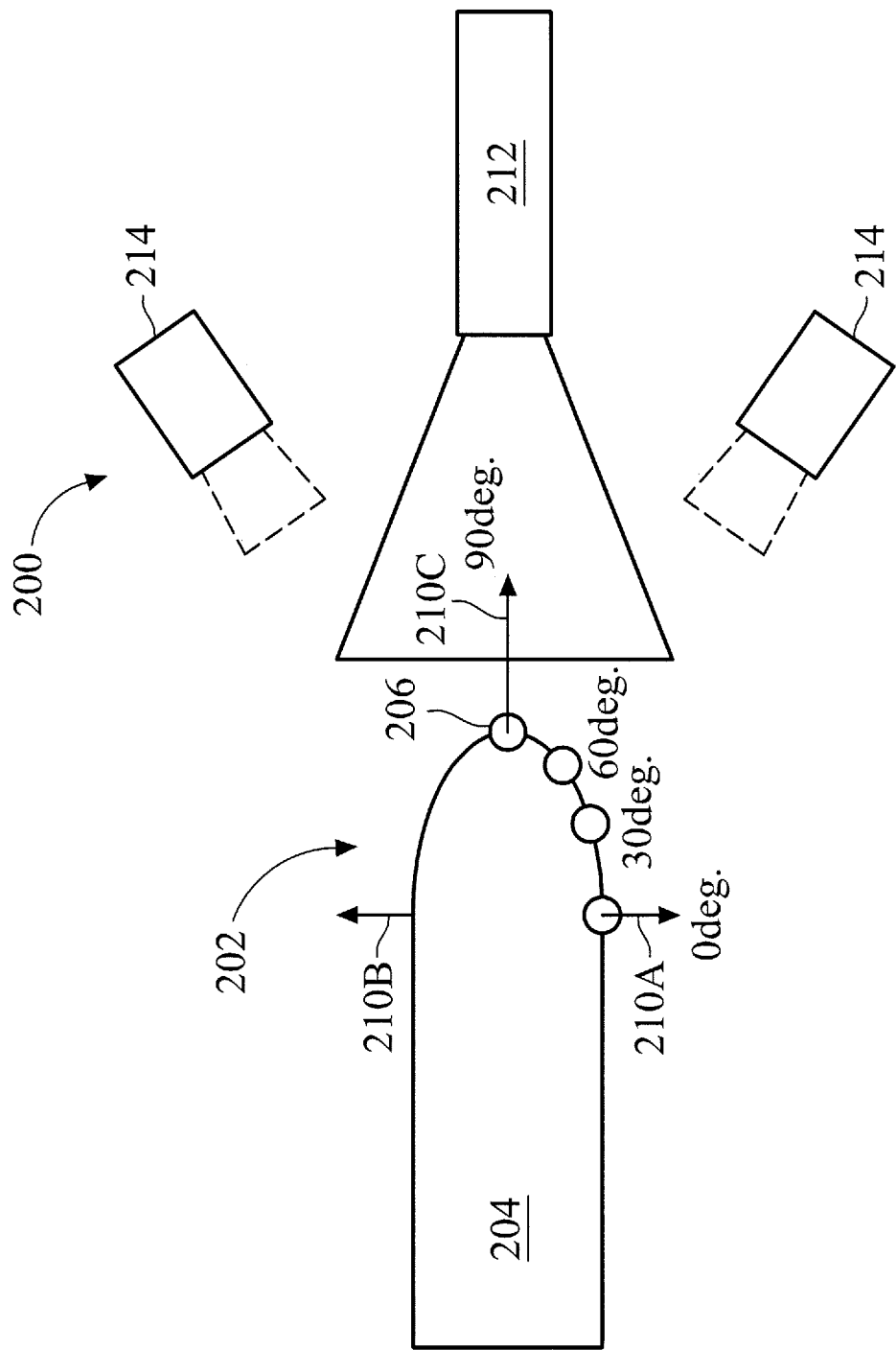
FIG. 2 is a cross sectional illustration of a bevel defect sensor, in accordance with some embodiments.

FIG. 2 is a cross sectional illustration of a bevel defect sensor 200, in accordance with some embodiments. As discussed above, a bevel 202 may refer to a side, or extreme edge of a workpiece 204 extending horizontally and generally around the workpiece's circumference. The bevel defect sensor 200 may be oriented around various positions around the bevel 202 vertically. For example, positions around a bevel may be notated in degrees, such as 0, 30, 60, 90, 120, 150, or 180 degrees, with either 0 or 180 degrees representing a transition from a curved bevel portion of a workpiece to a flat top or bottom portion of a workpiece. Also, the degrees notations may refer to a radial orientation of a line normal (e.g., a normal line) to the curve of the bevel. The line normal to a curve at a given point as referenced in degrees is the line perpendicular to the line that is tangent at a same point. Defect sensor orientations between the 0 degree line normal 210A and 180 degree line normal 210B may be referred to as bevel defect sensors. Stated another way, bevel defect sensors may be oriented to collect sensor data from a line normal angle between and including the 0 degree line normal 210A and the 180 degree line normal 210B. For example, a line normal at a most extreme end or edge of a workpiece may be a 90 degree line normal 210C. A bevel defect sensor configured to collect sensor data when oriented from the 90 degree line normal may be referred to as a 90 degree line normal bevel defect sensor 212. Other bevel defect sensors 214 may also be located at other line normals between the 90 degree line normal 210C and the 0 degree line normal 210A or between the 90 degree line normal 210C and the 180 degree line normal 210B.

Figure 3:
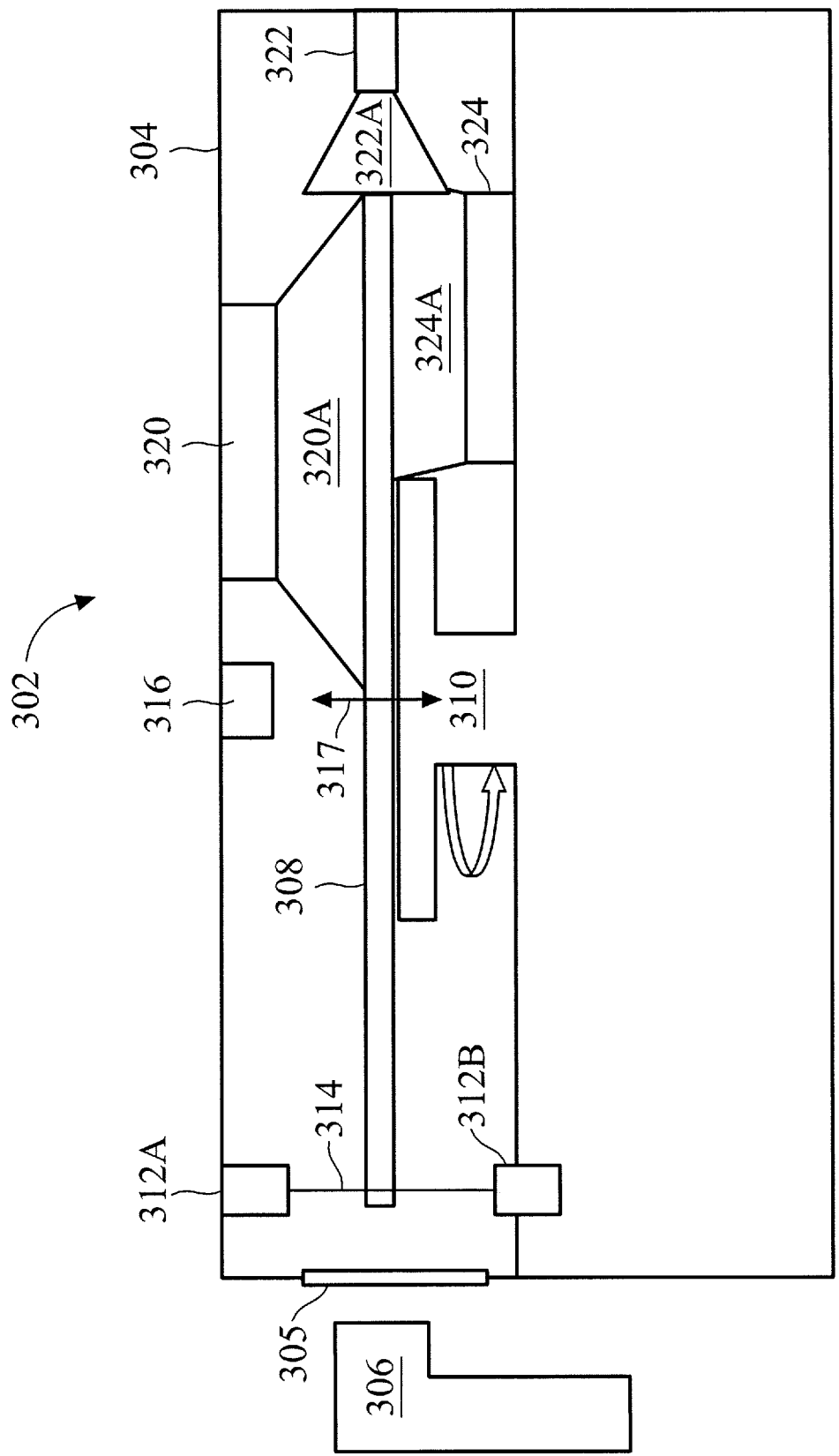
FIG. 3 is a cross sectional illustration of a defect station with an orientation sensor, in accordance with some embodiments.

FIG. 3 is a cross sectional illustration of an orientator inspection station 302, in accordance with some embodiments. An orientator inspection station 302 may be an inspection station that also includes an orientation sensor which may collect sensor data concerning a workpiece while the defect sensors are also collecting sensor data concerning the workpiece. The orientator inspection station 302 may be within an inspection station chamber 304 which may be closable to (e.g., with a door 305 that may open or close), or open to a transfer chamber that includes a robotic arm 306 configured to transfer a workpiece 308 to and from the orientator inspection station 302.

The orientator inspection station 302 may include a rotatable pedestal 310. The robotic arm 306 may be configured to deposit the workpiece 308 on the pedestal 310 (e.g., to be supported on the pedestal) and to reorient the workpiece 308 (e.g., move it laterally toward or away from the pedestal 310). The rotatable pedestal 310 may be configured to be rotated, such as in a counterclockwise or clockwise direction around an axis of rotation 317. By rotating a workpiece, an orientation sensor 312A, 312B may detect an orientation fiducial on the workpiece 308. The orientation fiducial may be any type of fiducial to indicate a particular angular orientation of the workpiece 108, such as a notch (e.g., a cut into the workpiece 108 from the circumference of the workpiece 308, such as in a "v" shape) or a flat (e.g., a straight portion of a workpiece 308 bezel along an otherwise curved circumference). In certain embodiments, an orientation sensor 312A, 312B may include an emitter and detector pair in which an emitter 312A (alternatively, 312B) emits detectible radiation 314 (e.g., a laser beam) which is detected by a detector 312B (alternatively, 312A). For example, the radiation may be detectible only at a location along the workpiece's bezel where there is an orientation fiducial, such as a notch or a flat. In particular embodiments, the orientator inspection station 302 may also include a center sensor 316, which may detect whether the workpiece 308 is centered on the pedestal 310, such as at an axis of rotation 317. For example, the center sensor 316 may be configured to detect a location of a center fiducial (e.g., a fiducial or a landmark at a center of a workpiece 308 distinguishable by, for example, shape, texture, or color) or may be determined to determine distances between the center of rotation to the periphery of the workpiece 308 along a linear path so that a workpiece 308 center point offset may be calculated by geometric analysis of the measurements.

The orientator inspection station 302 may also include at least one defect sensor 320, 322, 324. For example, a top defect sensor 320 may be configured to detect workpiece defects along a top of the workpiece 308 (e.g., within a scanning region 320A of the top defect sensor 320). A bevel defect sensor 322 may be configured to detect workpiece defects along a side or bevel of the workpiece 308 (e.g., within a scanning region 322A of the bevel defect sensor 322). A bottom defect sensor 324 may be configured to detect workpiece defects along a bottom of a workpiece 308 (e.g., within a scanning region 324A of the bottom defect sensor 324). In certain embodiments, the scanning regions of these sensors may overlap, such as an overlap between the scanning region 324A of the bottom defect sensor 324 and the scanning region 322A of the bevel defect sensor 322. In particular embodiments, the scanning regions may refer to a field of view, such as where the defect sensors 320, 322, 324 are image sensors (e.g., a charge coupled device (CCD), complementary metal-oxide-semiconductor (CMOS) or N-type metal-oxide semiconductor (NMOS) image sensors). In additional embodiments, the defect sensors 320, 322, 324 may be a scanning electron microscope (SEM) or other type of sensor that may be utilized to detect defects along a surface of the workpiece 308.

In further embodiments, different types of defect sensors may be at different defect sensor orientations (e.g., top, bevel, or bottom). For example, the top defect sensor 320 and the bottom defect sensor 324 may be one type of image sensor (e.g., a CCD) while the bevel defect sensor 322 may be another type of image sensor (e.g., a SEM).

In certain embodiments, the rotatable pedestal 310 may be configured to be rotated, such as in a counterclockwise or clockwise direction around an axis of rotation while both the orientation sensor 312A, 312B and the defect sensors 320, 322, 324 are inspecting the workpiece simultaneously. However, in certain embodiments, the rotatable pedestal 310 may be operated for the purpose of the orientation sensor's 322A, 322B search for the orientation fiducial and separately (e.g., at a separate time) for the purpose of the defect sensor's 320, 322, 324 search for a workpiece defect. Also, the rotatable pedestal may be configured for both constant rotation (e.g., rotating at a consistent speed without stopping) or intermittent rotation (e.g., rotating with intermittent stops that allow a defect sensor to capture sensor data of a still workpiece 308 at the intermittent stops).

In various embodiments, the various sensors may be fixed within the inspection station chamber 304. For example, the defect sensors 320, 322, 324 may be fixed relative to the pedestal 310. Also, the defects sensors 320, 322, 324 may be fixed relative also to the orientation sensor 312A and/or the center sensor 316.

Figure 4:
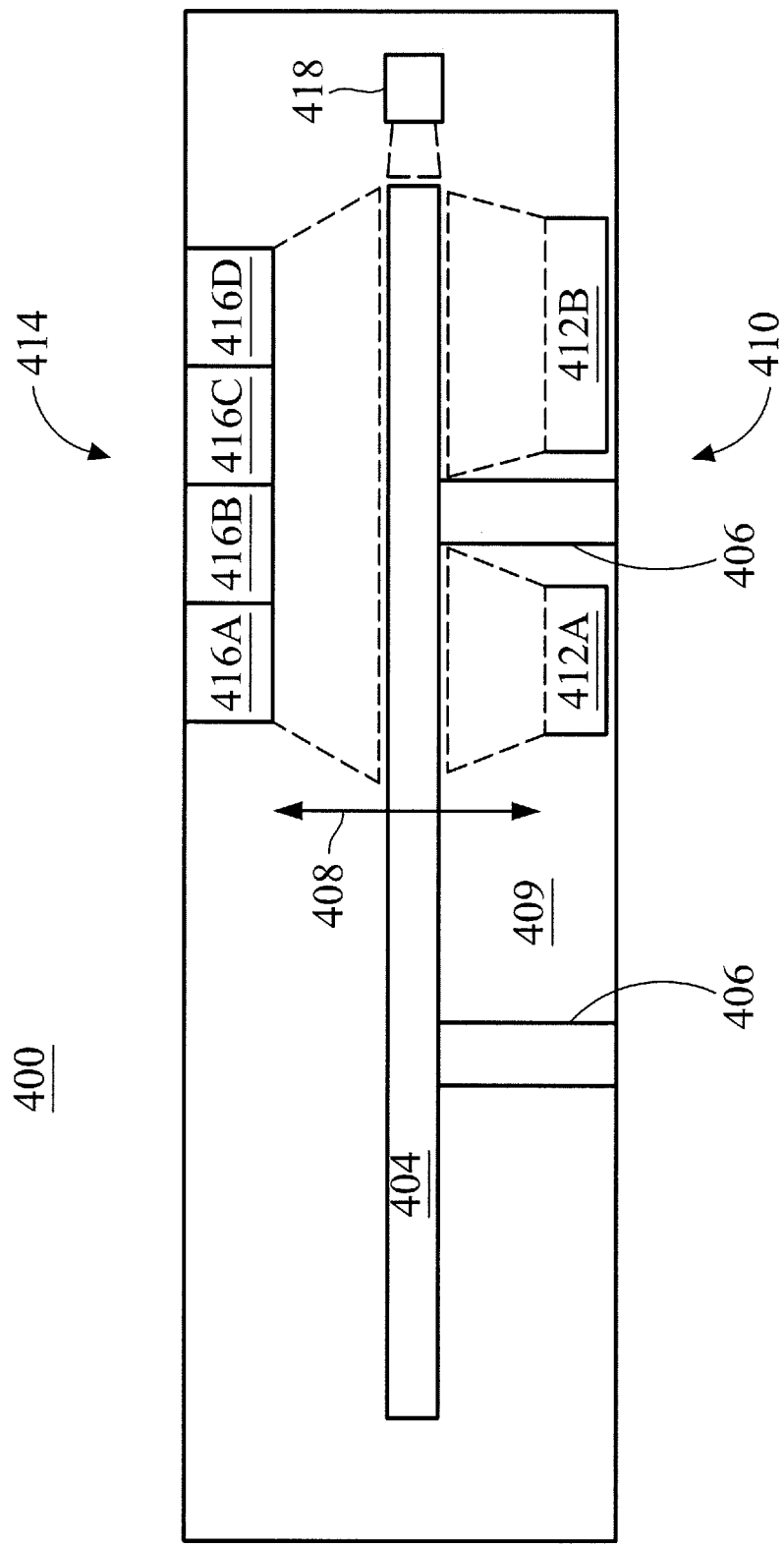
FIG. 4 is a cross sectional illustration of a defect station with multiple defect sensors, in accordance with some embodiments.

FIG. 4 is a cross sectional illustration of an inspection station 400 with multiple defect sensors, in accordance with some embodiments. The inspection station 400 may include a workpiece 404 similar to that discussed above. However, the pedestal 406 may be open (e.g., without a solid center portion close to the axis of rotation 408). Accordingly, more of the bottom of the workpiece 404 may be accessible to bottom defect sensors 410 than in other types of orientator inspection stations, such as that illustrated with the earlier figure. Specifically, the pedestal 406 may have an opening 409. However, the pedestal 406 may still be configured to spin around the axis of rotation 408 to move or spin the workpiece 404 around the axis of rotation 408. Among the bottom defect sensors 410, there may be a bottom defect sensor 412A configured to collect sensor data from within the opening 409.

There may be multiple bottom defect sensors 410 and multiple top defect sensors 414. Each of these defect sensors (e.g., either among the set of bottom defect sensors 410 or set of top defect sensors 414) may be a same or different type of defect sensor. For example, among the bottom defect sensors 410, a first bottom defect sensor 412A may be a first type of defect sensor while the second bottom defect sensor 412B may be a second type of defect sensor. Alternatively, both of the bottom defect sensors 412A, 412B may be a same type of defect sensor. Similarly, among the top defect sensors 414, each of the constituent defect sensors 416A, 416B, 416C, 416D may be a same or different types of defect sensors. For example 416A and 416C may be one type of defect sensor while 416B and 416D may be another type of defect sensor. The same type of arrangement may be utilized when the bevel defect sensor 418 may constitute multiple defect sensors (e.g., where different bevel defect sensors 418 may be a same type or different type of defect sensor). In certain embodiments, having multiple types of defect sensors within a defect sensor set (e.g., among top defect sensors, or among bottom defect sensors, or among bevel defect sensors) may yield more variety in terms of sensor data (e.g., due to the detection of different types of sensor data). Also, the different types of sensor data may cover a same or abutting region or area of a workpiece, and be cross referenceable to offer more robust defect detection than if only a single type of sensor was utilized for a particular region or abutting regions of a workpiece.

Furthermore, although defect sensors are illustrated as being on only one side of the axis of rotation 408, defect sensors may also be located at more than one side of the axis of rotation 408 as desired for different applications in various embodiments. For example, defect sensors may be located across a diameter of a workpiece and across both sides of an axis of rotation.

Figure 5A:
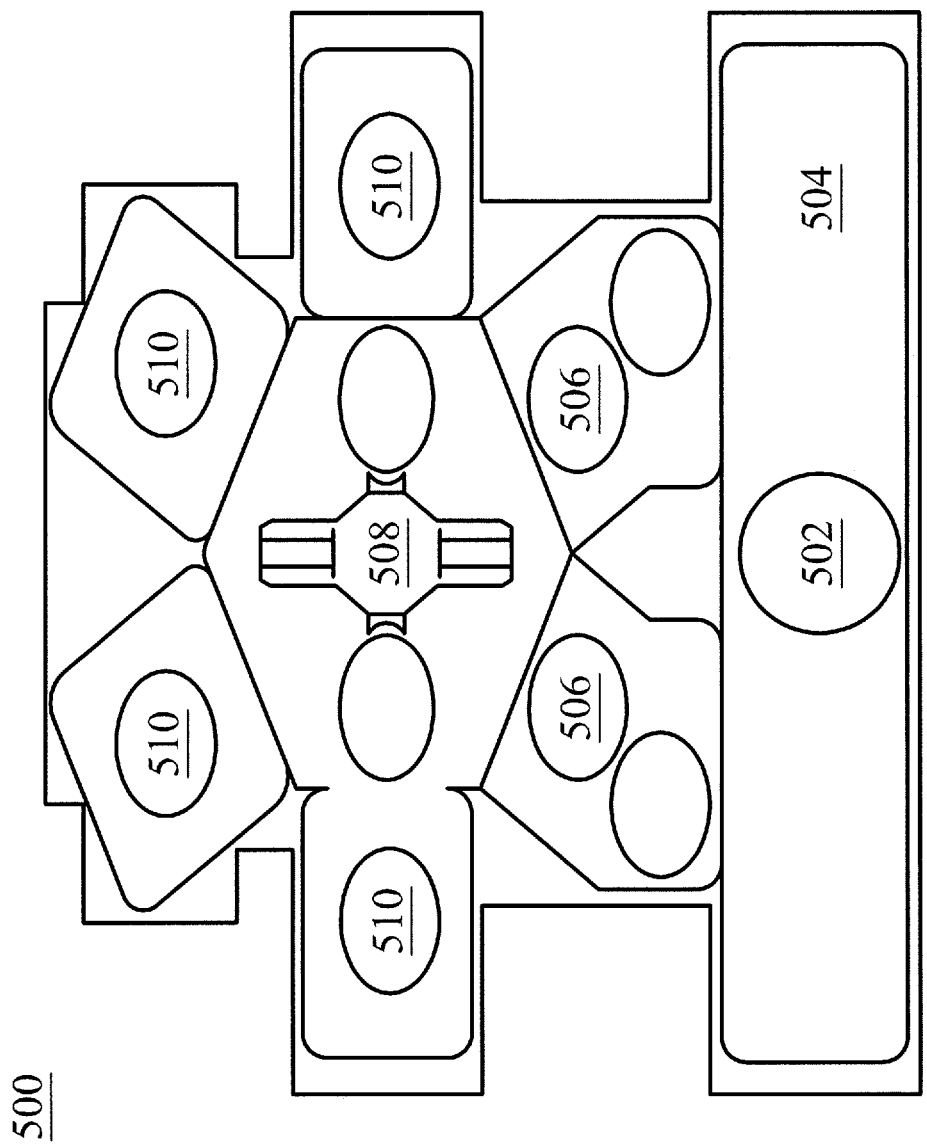
FIG. 5A is an illustration of a process workstation with an inspection station centrally located in a transfer chamber, in accordance with some embodiments.

FIG. 5A is an illustration of a process workstation 500 with an inspection station 502 centrally located in a first transfer chamber and load port 504, in accordance with some embodiments. The process workstation 500 may also include load ports 506, a second transfer chamber 508, and various processing chambers 510. The first transfer chamber and load port 504 may be a chamber of the process workstation 500 that may function as both a transfer station and a load port. For example, the first transfer chamber and load port 504 may include a robotic arm and be configured to transfer workpieces among the load ports 506 and the inspection station 502. The first transfer chamber and load port 504 may also function as a load port by being a first or last place a wafer is located when being processed by the process workstation 500. The second transfer chamber 508 may include a robotic arm and be configured to transfer workpieces among the processing chambers 510 and the load ports 506. The robotic arms may be movable and/or extendable between the various load ports 506, processing chambers 510 and/or inspection station 502 to a degree sufficient to manipulate a workpiece within various load ports 506, processing chambers 510, and/or inspection station 502. The inspection station 502 may be located at around a center part of the first transfer chamber and load port 504. However, in other embodiments, an inspection station may also, or instead, be located in the second transfer chamber 508, a load port 506, and/or a processing chamber 510.

The processing chambers 510 may include any processing chamber for receipt and processing of a workpiece or other semiconductor workpiece. Example processes that may be performed in these processing chambers include processes related to physical vapor deposition (PVD), chemical vapor deposition (CVD), chemical mechanical planarization (CMP), diffusion (DIF), wet etching, dry etching, photolithography, after developed inspection (ADI), after etched inspection (AEI), critical dimension (CD) inspection, scanning electron microscope (SEM) inspection, critical dimension scanning electron microscope (CD-SEM) inspection, wet cleaning, dry cleaning, and plasma etching.

Figure 5B:
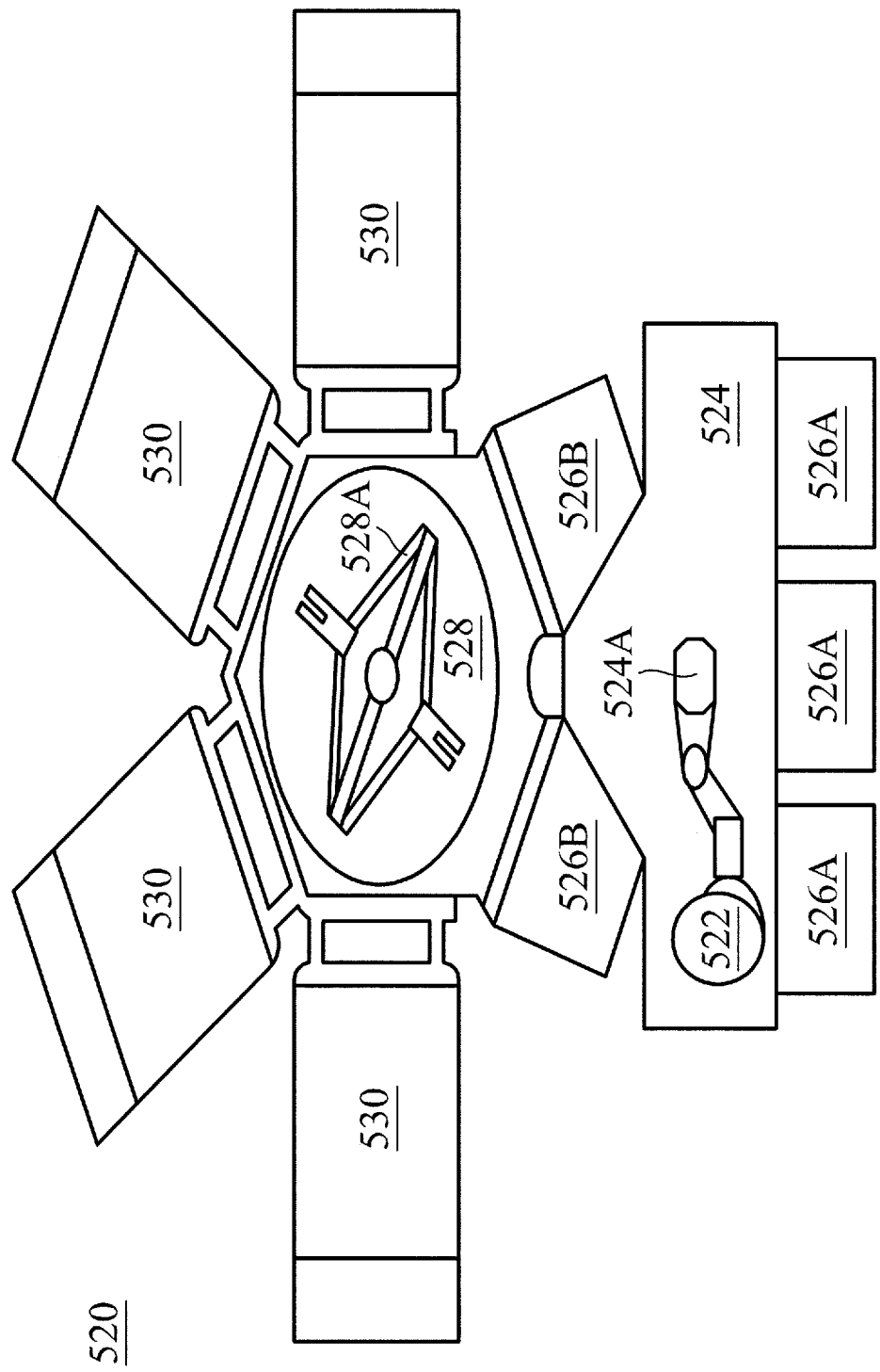
FIG. 5B is an illustration of a process workstation with an inspection station located toward a side of a transfer chamber, in accordance with some embodiments.

FIG. 5B is an illustration of a process workstation 520 with an inspection station 522 located toward a side of a first transfer chamber 524, in accordance with some embodiments. The process workstation 520 may also include load ports 526A, 526B, a second transfer chamber 528, and various processing chambers 530. The first transfer chamber 524 may include a robotic arm 524A and be configured to transfer workpieces among the load ports 526A, 526B and the inspection station 522. The second transfer chamber 528 may include a robotic arm 528A and be configured to transfer workpieces among the processing chambers 530 and the load ports 526B. The robotic arms 524A, 528A may be movable and/or extendable between the various load ports 526A. 526B, processing chambers 530 and/or inspection station 522 to a degree sufficient to manipulate a workpiece within various load ports 526A, 526B, processing chambers 530, and/or inspection station 522. The inspection station 522 may be located at around a side part of the first transfer chamber 524. However, in other embodiments, an inspection station may also, or instead, be located in the second transfer chamber 528, load ports 526A, 526B, and/or processing chambers 530. Also, one of the two load ports 526B may be specific for workpiece ingress toward the processing chambers 530 while the other of the two load ports 526B is specific for egress from the processing chambers 530.

Figure 5C:
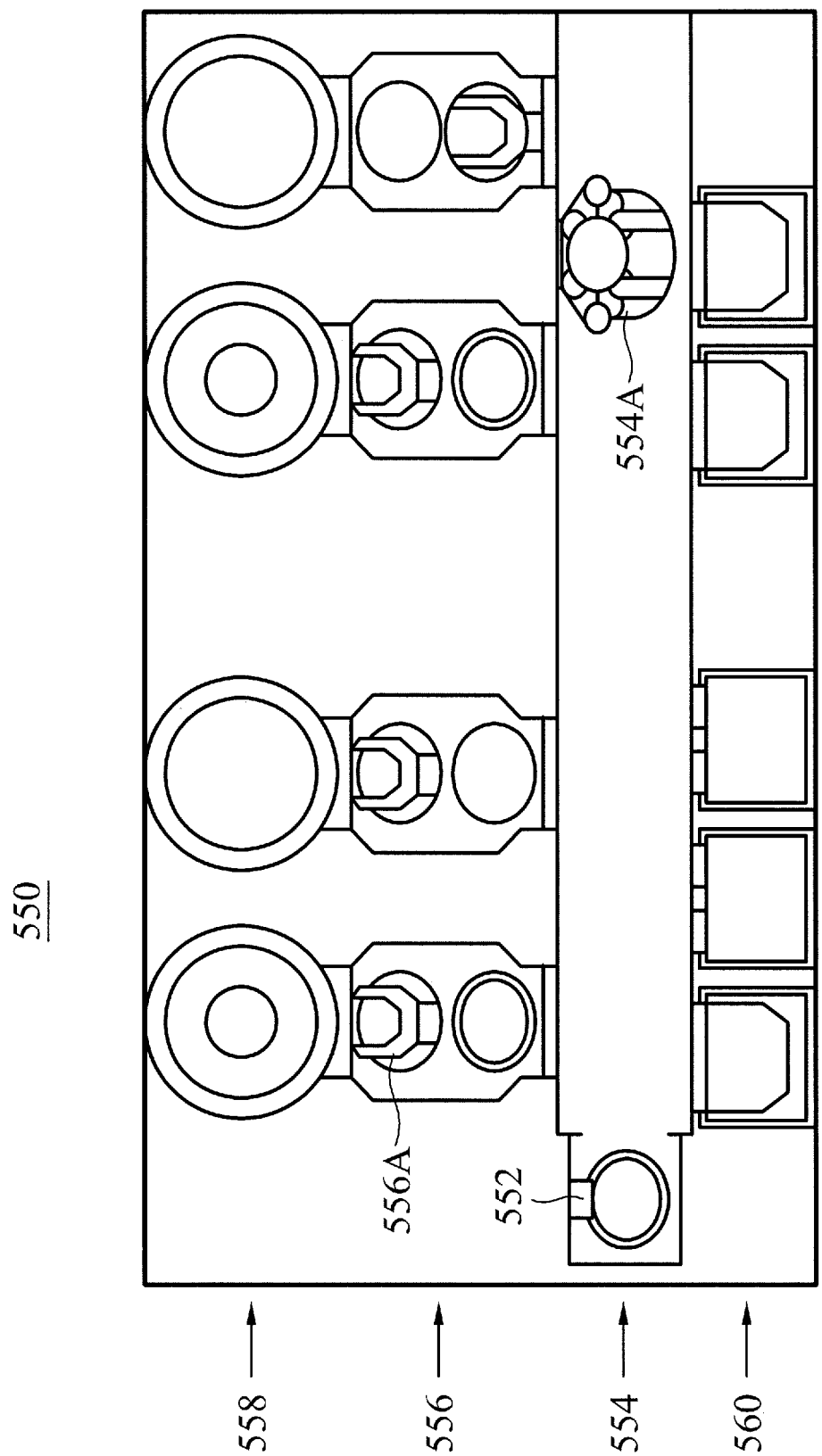
FIG. 5C is an illustration of a a process workstation with an inspection station located toward a far side of a transfer chamber, in accordance with some embodiments.

FIG. 5C is an illustration of a process workstation 550 with an inspection station 552 located toward a far side of a transfer chamber 554, in accordance with some embodiments. By being on a far side of a transfer chamber 554, a robotic arm may not need to reach around or move around the inspection station 552 when handling workpieces or other materials. However, in other embodiments, an inspection station may also, or instead, be located in a load port 556. Processing chamber 558, and/or outer load port 560.

The process workstation 550 may have individual load ports 556 for each processing chamber 558, in accordance with some embodiments. The process workstation 550 may include four processing chambers 558, which are each interfaced with an individual load port 556. Each individual load port 556 may have a robotic arm 556A with which to move a workpiece between a respective processing chamber 558 and individual load port 556 and/or the transfer chamber 554. The transfer chamber 554 may include a robotic arm 554A which may move within the transfer chamber 554 and transfer workpieces among various load ports 556 and outer load ports 560. By having a robotic arm 556A within each individual load port 556, another transfer chamber adjacent the processing chambers 558 may not be necessary as the robotic arm 556A within the load port 556 may directly transfer a workpiece between a respective processing chamber 558 and the load port 556 and/or the transfer chamber 554.

Figure 6:
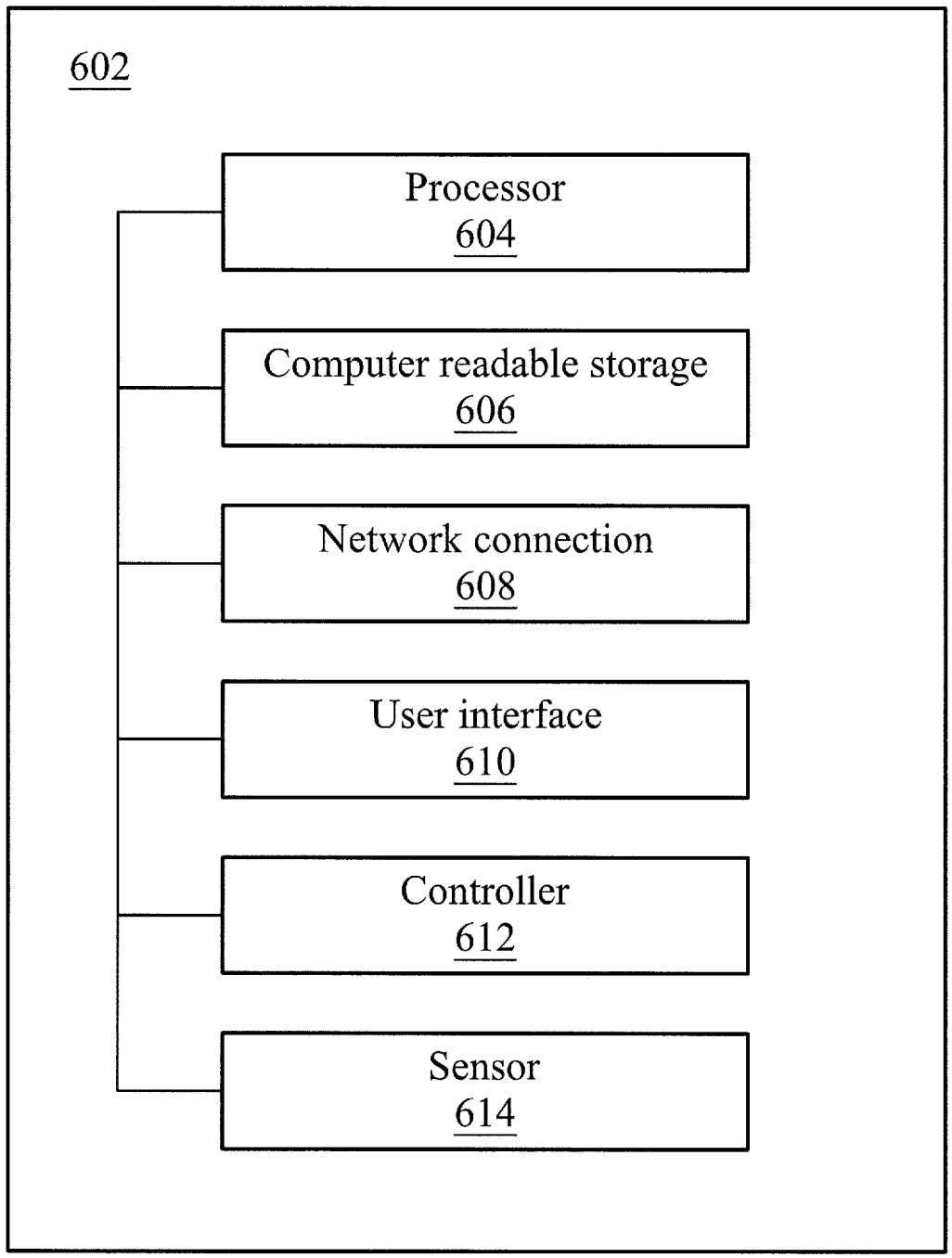
FIG. 6 is a block diagram of various functional modules of a process workstation system, in accordance with some embodiment.

FIG. 6 is a block diagram of various functional modules of a process workstation system 602, in accordance with some embodiments. The process workstation system 602 may include an inspection station, as discussed above. The process workstation system 602 may include a processor 604. In further embodiments, the processor 604 may be implemented as one or more processors.

The processor 604 may be operatively connected to a computer readable storage module 606 (e.g., a memory and/or data store), a network connection module 608, a user interface module 610, a controller module 612, and a sensor module 614. In some embodiments, the computer readable storage module 606 may include process workstation operation logic that may configure the processor 604 to perform the various processes discussed herein. The computer readable storage 606 may also store data, such as sensor data characterizing workpiece defects, control instructions for a process workstation and/or robotic arm to facilitate workpiece defect sensor data collection, identifiers for a workpiece, identifiers for an inspection station, identifiers for a process workstation, identifiers for a semiconductor workpiece fabrication process, and any other parameter or information that may be utilized to perform the various processes discussed herein.

The network connection module 608 may facilitate a network connection of the process workstation system 602 with various devices and/or components of the process workstation system 602 that may communicate (e.g., send signals, messages, instructions, or data) within or external to the process workstation system 602. In certain embodiments, the network connection module 608 may facilitate a physical connection, such as a line or a bus. In other embodiments, the network connection module 608 may facilitate a wireless connection, such as over a wireless local area network (WLAN) by using a transmitter, receiver, and/or transceiver. For example, the network connection module 608 may facilitate a wireless or wired connection with the processor 604 and the computer readable storage 606.

The process workstation system 602 may also include the user interface module 610. The user interface may include any type of interface for input and/or output to an operator of the process workstation system 602, including, but not limited to, a monitor, a laptop computer, a tablet, or a mobile device, etc.

The process workstation system 602 may include a controller module 612. The controller module 612 may be configured to control various physical apparatuses that control movement or functionality for a robotic arm, process workstation, defect sensor, inspection station, processing chamber, or any other controllable aspect of a process workstation system. For example, the controller module 612 may be configured to control movement or functionality for at least one of a door of a chamber, a rotational motor that rotates a pedestal around an axis of rotation, and the like. For example, the controller module 612 may control a motor or actuator. The controller may be controlled by the processor and may carry out the various aspects of the various processes discussed herein.

The sensor module 614 may represent a defect sensor configured to collect sensor data. As discussed above, a process workstation may include defect sensors. These defect sensors may be configured to collect sensor data as the process workstation moves a workpiece between a load port and at least one processing chamber. These defect sensors may be configured for collection of sensor data at any point of a workpiece's transportation, such as while held by a robotic arm, while awaiting transport by a robotic arm, or while en route between a load port and at least one processing chamber.

In particular embodiments, these defect sensors may be part of a inspection station. The inspection station may be a stop for the workpiece while en route between a load port and at least one processing chamber. At a defect station, for example, a top defect sensor may be configured to detect workpiece defects along a top of a workpiece (e.g., within a scanning region of the top defect sensor). A bevel defect sensor may be configured to detect workpiece defects along a side or bevel of the workpiece (e.g., within a scanning region of the bevel defect sensor). A bottom defect sensor may be configured to detect workpiece defects along a bottom of a workpiece (e.g., within a scanning region of the bottom defect sensor). In certain embodiments, the scanning regions of these sensors may overlap, such as an overlap between the scanning region of the bottom defect sensor and the scanning region of the bevel defect sensor. In particular embodiments, the scanning regions may refer to a field of view, such as where the defect sensors are image sensors. In additional embodiments, the defect sensors may other types of sensor that may be utilized to detect workpiece defects along a surface of the workpiece.

Figure 7:
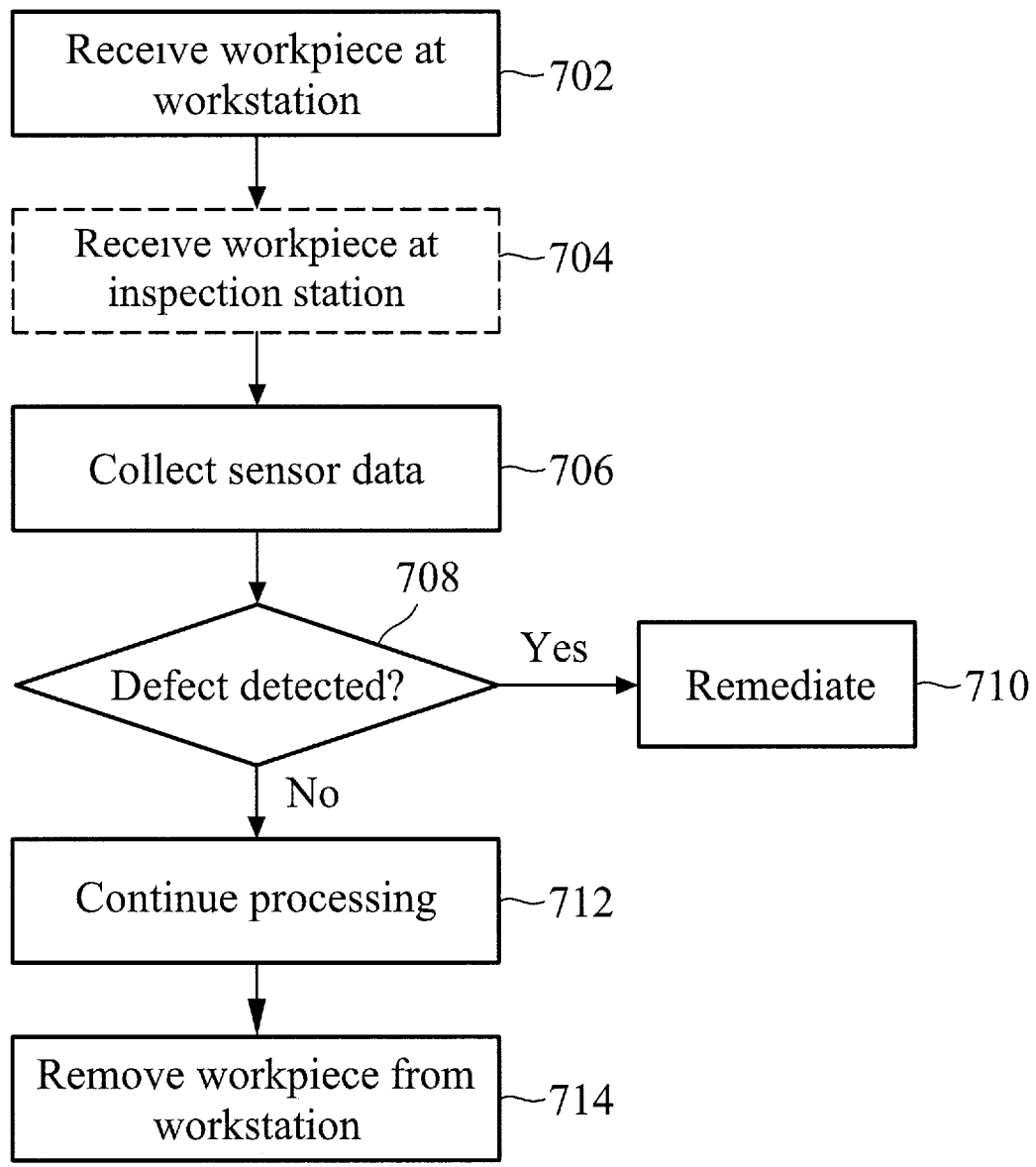
FIG. 7 is a flow chart of a process workstation process, in accordance with some embodiments.

FIG. 7 is a flow chart of a process workstation process 700, in accordance with some embodiments. The process workstation process 700 may be performed by a process workstation system with or without an inspection station, as discussed above. It is noted that the process 700 is merely an example, and is not intended to limit the present disclosure. Accordingly, it is understood that additional operations may be provided before, during, and after the process 700 of FIG. 7, certain operations may be omitted, certain operations may be performed concurrently with other operations, and that some other operations may only be briefly described herein.

At operation 702, a workpiece may be received at a process workstation. The workpiece may be received by being loaded into or onto a load port from a place external to the process workstation. For example, the workpiece may be loaded onto the load port from an external AMHS system and/or external robotic arm. From the load port, the workpiece may be accessible to a robotic arm within the process workstation. For example, the workpiece may be accessible to a robotic arm within a transfer chamber of the process workstation. The robotic arm at the transfer chamber may be configured to move the workpiece to other regions or chambers of the process workstation.

At operation 704, optionally, the workpiece may be received at an inspection station. The inspections station may receive a workpiece transported from a load port to a processing chamber, or from the inspection station to a load port. An inspection station may be a region of the process workstation specific for the inspection of a workpiece. As noted above, the inspection station may be physically located at any region of a process workstation, such as within a transfer chamber, a load port, and/or a processing chamber. Specifically, the inspection station may include a pedestal that may rotate the workpiece while defect sensors, such as a bevel defect sensor, collects sensor data that may characterize a workpiece defect at the inspected region of the workpiece. In certain embodiments, the inspection station may also double or be combined with other sensors that do not inspect the workpiece for workpiece defects, such as an orientation sensor configured to detect an orientation fiducial on a workpiece to determine an angular orientation for the workpiece.

The workpiece may be at the inspection station by being placed on a pedestal by a robotic arm. In particular embodiments, the robotic arm may be specific for the purpose of placing the workpiece on the pedestal of the inspection station, such as a robotic arm that only moves a workpiece between another chamber or region of the process workstation and the inspection station. In other embodiments, the robotic arm may be part of a transfer chamber, a load port, or any other component of a process workstation not specifically related to the inspection station. Stated another way, the robotic arm may have functionalities other than placing the workpiece on the pedestal of the inspection station in a desired manner.

At operation 706, workpiece defects may be assessed using defect sensors at the process workstation. The sensor data from which workpiece defects may be assessed may be collected from a workpiece transported from a load port to a processing chamber, or from the inspection station to a load port.

Various types of defect sensors may be utilized, such as optical defect sensors, weight defect sensors, temperature defect sensors, and the like. Examples of optical defect sensors may include, for example, a charge coupled device (CCD) or scanning electron microscope (SEM). These optical defect sensors may detect radiation across the visible light or non-visible light spectrum (e.g., the infrared spectrum). Weight defect sensors may be configured to detect a weight of a workpiece. For example, a workpiece may be deposited on a weight defect sensor as the workpiece is either handled or awaiting transport (e.g., depositing a workpiece on a weight defect sensor on a robotic arm or within a load port or other region of the process workstation). Temperature defect sensors may be configured to assess the temperature of a workpiece. For example, temperature defect sensors may include an infrared defect sensor configured to detect temperature as a function of infrared radiation, or a temperature defect sensor in a chamber that detects for changes when a workpiece is within the chamber as opposed to when the workpiece is not in the chamber. In certain embodiments, a single defect sensor may be utilized to inspect a workpiece for defects. However, in other embodiments, multiple defect sensors may be utilized either simultaneously or in series to inspect a workpiece for defects.

As introduced above, workpiece defects may include any type of defect detectible by the defect sensor which may reduce workpiece fabrication yield. Examples of workpiece defects detectible from image sensor data may include a crack, discoloration, scratch, peel, and/or a chip on a workpiece. Workpiece defect detection may be accomplished through the utilization of workpiece defect detection techniques, such as by the detection of non-uniformities, outliers, and/or variances as detected within collected sensor data. For example, workpiece defect detection techniques may assess image data (e.g., image data of multiple images, or a video) captured of a workpiece as the workpiece spins. Different frames or discrete parts (e.g., images or parts of images) of the image data may be compared to determine the presence of workpiece defects as abnormalities or outliers in the image data. For example, edge detection, thresholding, color based segmentation, or other types of image segmentation techniques may be utilized to find various features in the image data. Then, based on comparing the detected features, outliers in the data may be determined as possible workpiece defects via supervised or unsupervised learning. The determination or definitions of outliers may be made in accordance with conventional statistical analysis for outliers. In certain embodiments, conventional workpiece defect detection techniques may be utilized for the detection of workpiece defects and thus will not be discussed in detail herein.

Furthermore, defect sensors may assess workpieces over time by collecting sensor data from a single workpiece as it progresses through a process workstation, or across multiple workpieces inspected by a particular defect sensor. For example, defect sensors may collect temperature data, image data, and/or weight data as a single workpiece progresses through a process workstation, or across multiple workpieces inspected by a particular defect sensor. Accordingly, by analyzing the aggregated data over time, a workpiece defect may be determined based on detection of an outlier from the aggregated data. In certain embodiments, these outliers may determine threshold values, which when passed, may define a workpiece defect. These outliers may be determined in accordance with conventional statistical analysis for outliers. For example, these outliers may define threshold values for a workpiece that is too heavy or too light, which may be indicative of a workpiece that is broken.

In certain embodiments, defect sensors may be configured to operate concurrently with operation of a pedestal (e.g., as the pedestal turns). Accordingly, in certain embodiments, operation 706 may be performed concurrently with aspects of operation 704.

At operation 708, a decision may be made as to whether a workpiece defect is detected. If a workpiece defect is detected, the process workstation process 700 may proceed to operation 710. If a workpiece defect is not detected, the process workstation process 700 may proceed to operation 712. In certain embodiments, the detection of the workpiece defect may be performed live as the workpiece is being inspected. For example, the sensor data from defect sensors may be collected and analyzed live or while the workpiece is being transported, with operation 708 executed upon completion of the analysis of the collected sensor data. In particular embodiments, the process workstation process 700 may pause as a set of sensor data is analyzed, pending resolution of operation 708 (e.g., pending determination of whether a workpiece defect is detected based on a particular set of sensor data).

At operation 710, remediation may be performed based on the detection of the workpiece defect. The remediation may include pausing the processing of the workpiece pending a spot fix (e.g., in situ fix of the workpiece defect) and/or removing or diverting the workpiece from processing in favor of processing another workpiece without the workpiece defect (e.g., a restart of processing with a new workpiece). In certain embodiments, the process of workpiece processing may be paused pending removal of the workpiece using the robotic arm. Once the defective workpiece (e.g., the workpiece with the workpiece defect) is removed, the process workstation process 700 may begin again at operation 702 with a new workpiece. In certain embodiments, remediation may be performed at the process workstation without removal of the workpiece. For example, where the workpiece defect may be a deposition of an undesirable artifact on the workpiece's surface, a fan or a blow may be activated at the process workstation to use air or gas to push off the undesirable artifact on the workpiece's surface to facilitate resumption of workpiece processing (e.g., proceed to operation 712).

At operation 712, workpiece processing may be continued should no workpiece defects be detected or if workpiece defects are sufficiently remediated. Stated another way, workpiece processing may be continued by continuing to transport the workpiece in furtherance of the processing of the particular inspected workpiece. For example, if the workpiece is inspected by a sensor at the robotic arm that is also transporting the workpiece, the robotic arm may continue to transport the workpiece if no detects are detected at the workpiece. As another example, workpiece processing may continue by removing the workpiece from the pedestal of an inspection station using the robotic arm for transport within a process workstation. The transport may be from the inspection station to a processing chamber, or from the inspection station to a load port.

At operation 714, the workpiece may be removed from the process workstation. The workpiece may be removed after a predetermined amount of processing of the workpiece is completed by the process workstation. The workpiece may be removed from a load port to a place external to the process workstation. For example, the workpiece may be removed from the load port using an external AMHS system and/or external robotic arm. In certain embodiments, the load port of operation 714 may be the same as the load port of operation 702. However, in other embodiments, the load port of operation 714 may be different than the load port of operation 702, such as where separate load ports are utilized for ingress and egress of workpieces.

In an embodiment, a workstation includes: a processing chamber configured to process a workpiece; a load port configured to interface with an environment external to the workstation; a robotic arm configured to transfer the workpiece between the load port and the processing chamber; and a defect sensor configured to detect a defect along a surface of the workpiece when transferred between the load port and the processing chamber.

In another embodiment, a workstation includes: a processing chamber configured to process a workpiece; a load port configured to interface with an environment external to the workstation; a robotic arm configured to transfer the workpiece between the load port and the processing chamber; an inspection station comprising: a defect sensor configured to detect a defect along a surface of the workpiece when transferred between the load port and the processing chamber, and a pedestal configured to rotate the workpiece, wherein the defect sensor is configured to detect the defect while the pedestal rotates the workpiece.

In another embodiment, a method includes: moving a workpiece to an inspection station, wherein the workpiece is en route to a processing chamber; detecting a defect along a surface of the workpiece while the workpiece is at the inspection station; and diverting the workpiece away from the processing chamber in response to detecting the defect.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A semiconductor workstation, comprising:
   a semiconductor processing chamber configured to receive and process an unfinished semiconductor wafer, wherein the semiconductor processing chamber is configured to perform a transformative process on the unfinished semiconductor wafer that produces a structural change in the unfinished semiconductor wafer;
   a load port configured to receive the unfinished semiconductor wafer before the unfinished semiconductor wafer is received by the semiconductor processing chamber, wherein the load port is further configured to interface with an environment external to the semiconductor workstation;
   a robotic arm configured to transfer the unfinished semiconductor wafer between the load port and the semiconductor processing chamber; and
   a defect sensor configured to detect a defect of the unfinished semiconductor wafer while being transferred between the load port and the semiconductor processing chamber by the robotic arm, wherein the defect sensor comprises a bevel defect sensor configured to collect defect sensor data along a beveled edge of the unfinished semiconductor wafer.

2. The semiconductor workstation of claim 1, wherein the defect sensor is part of an inspection station.

3. The semiconductor workstation of claim 2, wherein the inspection station comprises a door that separates the inspection station from the robotic arm.

4. The semiconductor workstation of claim 2, wherein:
   the inspection station comprises a pedestal configured to rotate the workpiece, and
   the defect sensor is configured to detect the defect while the pedestal rotates the workpiece.

5. The semiconductor workstation of claim 1, where a workstation housing encloses the workstation.

6. The semiconductor workstation of claim 1, wherein the defect sensor comprises at least one of a charge coupled sensor and a scanning electron microscope.

7. The semiconductor workstation of claim 1, wherein the defect sensor is disposed on the robotic arm.

8. A semiconductor workstation, comprising:
   a semiconductor processing chamber configured to receive and process an unfinished semiconductor wafer, wherein the semiconductor processing chamber is configured to perform a transformative process on the unfinished semiconductor wafer that produces a structural change in the unfinished semiconductor wafer;
   a load port configured to receive the unfinished semiconductor wafer before the unfinished semiconductor wafer is received by the semiconductor processing chamber, wherein the load port is further configured to interface with an environment external to the semiconductor workstation;
   a robotic arm configured to transfer the unfinished semiconductor wafer between the load port and the semiconductor processing chamber;
   an inspection station comprising:
      a defect sensor configured to detect a defect of the unfinished semiconductor wafer while being transferred between the load port and the semiconductor processing chamber by the robotic arm, wherein the defect sensor comprises a bevel defect sensor configured to collect defect sensor data along a beveled edge of the unfinished semiconductor wafer; and
      a pedestal configured to rotate the unfinished semiconductor wafer, wherein the defect sensor is configured to detect the defect while the pedestal rotates the unfinished semiconductor wafer.

9. The semiconductor workstation of claim 8, where a workstation housing encloses the semiconductor workstation.

10. The semiconductor workstation of claim 8, wherein the inspection station comprises a door that separates the inspection station from the robotic arm.

11. The semiconductor workstation of claim 8, wherein the inspection station is a region of a transfer chamber that includes the robotic arm.

12. The semiconductor workstation of claim 8, wherein, the robotic arm is configured to divert the workpiece from the processing chamber in response to detecting the defect.

13. The semiconductor workstation of claim 8, wherein the defect is at least one of: a scratch, discoloration, crack, chip, or peel.

14. The semiconductor workstation of claim 8, wherein the defect sensor is disposed on the robotic arm.

15. A method, comprising:
   moving an unfinished semiconductor wafer from a load port to a semiconductor processing chamber, wherein the semiconductor processing chamber is configured to perform a transformative process on the unfinished semiconductor wafer that produces a structural change in the unfinished semiconductor wafer;
   detecting a defect of the unfinished semiconductor wafer while the unfinished semiconductor wafer is being transferred from the load port to the semiconductor processing chamber by a robotic arm, wherein the detecting is performed by a defect sensor comprising a bevel defect sensor configured to collect defect sensor data along a beveled edge of the unfinished semiconductor wafer; and
   diverting the unfinished semiconductor wafer away from the semiconductor processing chamber in response to detecting the defect.

16. The method of claim 15, further comprising moving the unfinished semiconductor wafer from an initial semiconductor processing chamber to the inspection station.

17. The method of claim 15, further comprising moving a second unfinished semiconductor wafer to the inspection station in response to the detecting the defect.

18. The method of claim 15, further comprising detecting defects as a non-uniformity along the surface of the unfinished semiconductor wafer.

19. The method of claim 15, wherein the defect is at least one of: a scratch, discoloration, crack, chip, or peel.

20. The method of claim 15, wherein the defect sensor is disposed on the robotic arm.

* * * * *